(12) United States Patent
Hsia

(10) Patent No.: US 10,036,515 B2
(45) Date of Patent: Jul. 31, 2018

(54) LINEAR SOLID-STATE LIGHTING WITH LOW VOLTAGE CONTROL FREE OF ELECTRIC SHOCK AND FIRE HAZARD

(71) Applicant: Aleddra Inc., Renton, WA (US)

(72) Inventor: Chungho Hsia, Bellevue, WA (US)

(73) Assignee: ALEDDRA INC., Renton, WA (US)

( * ) Notice: Subject to any disclaimer, the term of this patent is extended or adjusted under 35 U.S.C. 154(b) by 0 days.

(21) Appl. No.: 15/874,752

(22) Filed: Jan. 18, 2018

(65) Prior Publication Data

US 2018/0156394 A1    Jun. 7, 2018

Related U.S. Application Data

(63) Continuation-in-part of application No. 15/836,170, filed on Dec. 8, 2017, which is a continuation-in-part of application No. 15/649,392, filed on Jul. 13, 2017, which is a continuation-in-part of application No. 15/444,536, filed on Feb. 28, 2017, now Pat. No. 9,826,595, which is a continuation-in-part of application No. 15/362,772, filed on Nov. 28, 2016, now Pat. No. 9,967,927, which is a continuation-in-part of application No. 15/225,748, filed on Aug. 1, 2016, now Pat. No. 9,743,484, which is a continuation-in-part of application No.
(Continued)

(51) Int. Cl.
| | | |
|---|---|---|
| *F21K 9/278* | (2016.01) |
| *F21V 23/00* | (2015.01) |
| *H05B 33/08* | (2006.01) |
| *F21V 25/12* | (2006.01) |
| *F21V 25/10* | (2006.01) |
| *F21Y 115/10* | (2016.01) |

(52) U.S. Cl.
CPC ............ *F21K 9/278* (2016.08); *F21V 23/005* (2013.01); *F21V 25/10* (2013.01); *F21V 25/12* (2013.01); *H05B 33/089* (2013.01); *H05B 33/0815* (2013.01); *F21Y 2115/10* (2016.08); *H05K 2201/10106* (2013.01)

(58) Field of Classification Search
None
See application file for complete search history.

(56) References Cited

U.S. PATENT DOCUMENTS 9,163,818 B2 * 10/2015 Hsia .................. F21V 25/04
9,923,325 B2 *  3/2018 Jansen ................ H01R 33/96
(Continued)

*Primary Examiner* — Minh D A
*Assistant Examiner* — James H Cho
(74) *Attorney, Agent, or Firm* — Han IP Corporation; Andy M. Han

(57) ABSTRACT

A linear light-emitting diode (LED) lamp comprising a housing, two lamp bases at two ends of the housing, a full-wave rectifier, an LED driving circuit, one or more LED arrays, at least two proximity sensors, and at least two pairs of electrical contacts controlled by the at least two proximity sensors, is used to replace a fluorescent tube or a conventional LED tube lamp. The at least two proximity sensors and the at least two pairs of electrical contacts configured to respectively perform proximity sensing between the two lamp bases and two sockets in an existing lamp fixture are operated by using a low DC voltage. When both two lamp bases are inserted in the two sockets, the at least two pairs of electrical contacts are driven to make an electrical coupling between the full-wave rectifier and the LED driving circuit.

18 Claims, 4 Drawing Sheets

Related U.S. Application Data

14/818,041, filed on Aug. 4, 2015, now Pat. No. 9,420,663, which is a continuation-in-part of application No. 14/688,841, filed on Apr. 16, 2015, now Pat. No. 9,288,867, which is a continuation-in-part of application No. 14/465,174, filed on Aug. 21, 2014, now Pat. No. 9,277,603, which is a continuation-in-part of application No. 14/135,116, filed on Dec. 19, 2013, now Pat. No. 9,163,818, which is a continuation-in-part of application No. 13/525,249, filed on Jun. 15, 2012, now Pat. No. 8,749,167.

(56) References Cited

U.S. PATENT DOCUMENTS

| | | | |
|---|---|---|---|
| 2012/0032610 A1* | 2/2012 | Kang | H02M 3/156 |
| | | | 315/297 |
| 2012/0181952 A1* | 7/2012 | Roeer | H05B 33/0809 |
| | | | 315/307 |
| 2013/0147350 A1* | 6/2013 | Yang | F21V 25/00 |
| | | | 315/52 |

* cited by examiner

LINEAR SOLID-STATE LIGHTING WITH LOW VOLTAGE CONTROL FREE OF ELECTRIC SHOCK AND FIRE HAZARD

CROSS-REFERENCE TO RELATED APPLICATIONS

The present disclosure is part of a continuation-in-part (CIP) application of U.S. patent application Ser. No. 15/836,170, filed 8 Dec. 2017, which is a CIP application of U.S. patent application of Ser. No. 15/649,392 filed 13 Jul. 2017, which is a CIP application of U.S. patent application Ser. No. 15/444,536, filed 28 Feb. 2017 and issued as U.S. Pat. No. 9,826,595 on 21 Nov. 2017, which is a CIP application of U.S. patent application Ser. No. 15/362,772, filed 28 Nov. 2016, which is a CIP application of U.S. patent application Ser. No. 15/225,748, filed 1 Aug. 2016 and issued as U.S. Pat. No. 9,743,484 on 22 Aug. 2017, which is a CIP application of U.S. patent application Ser. No. 14/818,041, filed 4 Aug. 2015 and issued as U.S. Pat. No. 9,420,663 on 16 Aug. 2016, which is a CIP application of U.S. patent application Ser. No. 14/688,841, filed 16 Apr. 2015 and issued as U.S. Pat. No. 9,288,867 on 15 Mar. 2016, which is a CIP application of U.S. patent application Ser. No. 14/465,174, filed 21 Aug. 2014 and issued as U.S. Pat. No. 9,277,603 on 1 Mar. 2016, which is a CIP application of U.S. patent application Ser. No. 14/135,116, filed 19 Dec. 2013 and issued as U.S. Pat. No. 9,163,818 on 20 Oct. 2015, which is a CIP application of U.S. patent application Ser. No. 13/525,249, filed 15 Jun. 2012 and issued as U.S. Pat. No. 8,749,167 on 10 Jun. 2014. Contents of the above-identified applications are incorporated herein by reference in their entirety.

BACKGROUND

Technical Field

The present disclosure relates to linear light-emitting diode (LED) lamps and more particularly to a linear LED lamp with a low voltage control configured to eliminate electric arcing that may cause internal fire when used with ballasts and to prevent electric shock current from reaching ground through a person's body when used with AC mains.

Description of the Related Art

Solid-state lighting from semiconductor light-emitting diodes (LEDs) has received much attention in general lighting applications today. Because of its potential for more energy savings, better environmental protection (no hazardous materials used), higher efficiency, smaller size, and much longer lifetime than conventional incandescent bulbs and fluorescent tubes, the LED-based solid-state lighting will be a mainstream for general lighting in the near future. As LED technologies develop with the drive for energy efficiency and clean technologies worldwide, more families and organizations will adopt LED lighting for their illumination applications. In this trend, the potential safety concerns such as risk of electric shock and fire become especially important and need to be well addressed.

In today's retrofit application of a linear LED tube (LLT) lamp to replace an existing fluorescent tube, consumers may choose either to adopt a ballast-compatible LLT lamp with an existing ballast used to operate the fluorescent tube or to employ an AC mains-operable LED lamp by removing/bypassing the ballast. Either application has its advantages and disadvantages. In the former case, although the ballast consumes extra power, it is straightforward to replace the fluorescent tube without rewiring, which consumers may have a first impression that it is the best alternative to fluorescent tube lamps. But the fact is that total cost of ownership for this approach is high regardless of very low initial cost. For example, the ballast-compatible LLT lamps work only with particular types of ballasts. If the existing ballast is not compatible with the ballast-compatible LLT lamp, the consumers will have to replace the ballast. Some facilities built long time ago incorporate different types of fixtures, which requires extensive labor for both identifying ballasts and replacing incompatible ones. Moreover, a ballast-compatible LLT lamp can operate longer than the ballast. When an old ballast fails, a new ballast will be needed to replace in order to keep the ballast-compatible LLT lamps working. Maintenance will be complicated, sometimes for lamps and sometimes for ballasts. The incurred cost will preponderate over the initial cost savings by changeover to the ballast-compatible LLT lamps for hundreds of fixtures throughout a facility. When the ballast in a fixture dies, all the ballast-compatible tube lamps in the fixture go out until the ballast is replaced. In addition, replacing a failed ballast requires a certified electrician. The labor costs and long-term maintenance costs will be unacceptable to end users. From energy saving point of view, a ballast constantly draws power, even when the ballast-compatible LLT lamps are dead or not installed. In this sense, any energy saved while using the ballast-compatible LLT lamps becomes meaningless with the constant energy use by the ballast. In the long run, ballast-compatible LLT lamps are more expensive and less efficient than self-sustaining AC mains-operable LLT lamps.

On the contrary, an AC mains-operable LLT lamp does not require a ballast to operate. Before use of an AC mains-operable LLT lamp, the ballast in a fixture must be removed or bypassed. Removing or bypassing the ballast does not require an electrician and can be replaced by end users. Each AC mains-operable LLT lamp is self-sustaining. If one AC mains-operable tube lamp in a fixture goes out, other lamps in the fixture are not affected. Once installed, the AC mains-operable LLT lamps will only need to be replaced after 50,000 hours. In view of above advantages and disadvantages of both ballast-compatible LLT lamps and AC mains-operable LLT lamps, it seems that market needs a most cost-effective solution by using a universal LLT lamp that can be used with the AC mains and is compatible with a ballast so that LLT lamp users can save an initial cost by changeover to such a universal LLT lamp followed by retrofitting the lamp fixture to be used with the AC mains when the ballast dies.

In the U.S. patent application Ser. No. 14/688,841, filed Apr. 16, 2015, two shock prevention switches and an all-in-one driving circuit are adopted in an LLT lamp such that AC power from either a ballast or the AC mains can operate the LLT lamp without operational uncertainty and electric shock hazards. In other words, no matter what a lamp fixture is configured as the AC mains- or a ballast-compatible fashion, the LLT lamp automatically detects configurations and works for either one. All of such LLT lamps, no matter whether AC mains-operable or ballast-compatible, are electrically wired as double-ended and have one construction issue related to product safety and needed to be resolved prior to wide field deployment. This kind of LLT lamps, if no shock prevention scheme is adopted in, always fails a safety test, which measures a through-lamp electric shock current. Because an AC-mains voltage applies to both opposite ends of the LLT lamps, the measurement of current leakage from one end to the other consistently results in a substantial current flow, which may present a risk of an electric shock during re-lamping. Due to this potential shock risk to the person who replaces the LLT lamps in an existing fluorescent tube fixture, Underwriters Laboratories (UL) uses its safety standard, UL 935, Risk of Shock During Relamping (Through Lamp), to do a current leakage test and to determine if the LLT lamps meet the consumer safety requirement. Although the LLT lamps used with a ballast can pass the current leakage test, some kinds of electric shock hazards do exist. Experimental results show that the skin of the person who touches an exposed bi-pin may be burned due to such an electric shock. Fortunately, a mechanism of double shock prevention switches used in applications with the AC mains is also effective in applications with the ballasts to prevent the electric shock from occurring, thus protecting consumers from such a hazard, no matter whether input voltage is from the AC mains or the ballast. Therefore, a universal LLT lamp that can work with either the AC mains or the ballast makes sense. The effectiveness of using double shock prevention switches for applications in the AC mains has been well addressed in U.S. Pat. No. 8,147,091, issued on Apr. 3, 2012. However, a conventional shock prevention switch has an inherent issue related to an electric arc when operated with a ballast. Unlike an AC voltage of 120 or 277 V/50-60 Hz from the AC mains, the output AC voltage and current from the ballast presents a negative resistance characteristic. The feature that originally supports a fluorescent tube to function properly becomes extremely detrimental to the conventional shock prevention switch due to the electric arc likely occurring between two electrical contacts that have a high electrical potential difference with a high frequency, such as 600 V/50 kHz. Once a consumer fails to follow installation instructions to install or uninstall linear LED tube lamps such that one of two ends of the tube lamp is in the fixture socket connected to a powered ballast, and the other end is tweaked to connect to or disconnect from the associated socket, an internal electric arcing may occur between the electrical contacts in the associated switch. The arcing even in a short period such as several seconds can generate high heat, burning and melting electrical contacts and neighboring plastic enclosures, creating a fire hazard. The AC voltage of 120 or 277 V/50-60 Hz from the AC mains does not have such an issue because its voltage is relatively low compared with the ballast output voltage of 600 V. Moreover, the AC frequency of 60 Hz automatically extinguishes an electric arc every 1/60 seconds, if existed. That is why a utility switch can be used in an electrical appliance to turn power on and off without any problem. However when used with the ballast, the electrical contacts used in the conventional shock prevention switch can easily be burned out due to the high-voltage and high-frequency arcing introduced between each gap of each pair of the electrical contacts in the conventional shock prevention switch when someone tries to abusively tweak to remove the tube lamp from the fixture with the ballast that has a power on it. Although such a situation is rare, an internal arcing, if occurred, does cause burning and even welding of the electrical contacts and melting of the plastic enclosure, so called internal fire, creating consumer safety issues.

Today, such LLT lamps are mostly used in a ceiling light fixture with a wall-mount power switch. The ceiling light fixture could be an existing one used with fluorescent tubes but retrofitted for LLT lamps or a specific LLT lamp fixture. The drivers that provide a proper voltage and current to LED arrays could be internal or external ones. Not like LLT lamps with an external driver that is inherently electric-shock free if the driver can pass a dielectric withstand test used in the industry, LLT lamps with an internal driver could have a shock hazard during relamping or maintenance, when the substantial through-lamp electric shock current flows from any one of AC voltage inputs through the internal driver connecting to LED arrays to the earth ground. Despite this disadvantage, LLT lamps with the internal driver still receive wide acceptance because they provide a stand-alone functionality and an easy retrofit for an LLT lamp fixture. As consumerism develops, consumer product safety becomes extremely important. Any products with electric shock or fire hazards and risk of injuries or deaths are absolutely not acceptable for consumers. However, commercially available LLT lamps with internal drivers, single-ended or double-ended, fail to provide effective solutions to the problems of possible electric shock and internal arcing and fire.

In the prior art mentioned above, the double shock protection switches with mechanical actuation mechanisms protruding outwards from both ends of the LLT lamp are proposed to control a line voltage from the AC mains or high voltages from the ballasts to connect to the LLT lamp. However, a length control of the LLT lamp becomes critical to operate the LLT lamp because sometimes the double shock protection switches may not be actuated by the mechanical actuation mechanisms. Also, the double shock protection switches directly control AC voltages such as 120 or 277 V/50~60 Hz from the AC mains or 600 V/45~65 kHz from the ballasts, which makes the conventional LLT lamp so vulnerable because such high voltages working on the double shock protection switches may easily cause internal fire if consumers abusively tweak the mechanical actuation mechanisms at both ends of the LLT lamp operable with a ballast during relamping. Another prior art may involve an electronic approach to eliminating electric shock. However, such an electronic approach may not be as reliable as expected, especially in real applications where the electronic approach continues to fail in electric shock and arcing situations. It is, therefore, the purpose of the present disclosure to disclose a novel low-voltage control approach to be used in the LLT lamp to eliminate above-mentioned electric shock and internal fire hazards and to work more reliably to protect consumers.

SUMMARY

A linear light-emitting diode (LED)-based solid-state tube (LLT) lamp comprising a housing, two lamp bases at two ends of the housing, a full-wave rectifier, an LED driving circuit, one or more LED arrays, at least two proximity sensors, at least one conductor protruding outwards from each lamp base, and at least two pairs of electrical contacts controlled by the at least two proximity sensors, is used to replace a fluorescent tube or a conventional LED tube lamp without the at least two proximity sensors and the at least two pairs of electrical contacts. The at least two proximity sensors and the at least two pairs of electrical contacts are configured to respectively perform proximity sensing between the two lamp bases and two sockets in an existing lamp fixture. When both two lamp bases are inserted in the two sockets, the at least two pairs of electrical contacts are driven by the at least two proximity sensors to make an electrical connection between the full-wave rectifier and the LED driving circuit, rather than between an alternate current (AC) voltage input and the full-wave rectifier, to power the LED driving circuit and the one or more LED arrays. When either one of the two lamp bases is not inserted in one of the two sockets, the at least two pairs of electrical contacts are disabled so as to disconnect a direct current (DC) current flow from the full-wave rectifier to the LED driving circuit. Without such DC current flowing to power the LED driving circuit, a substantial through-lamp electric shock current is considered not to exist. Furthermore, the at least two pairs of electrical contacts are interconnected between the full-wave rectifier and the LED driving circuit, the DC voltage provided to the LED driving circuit can be made small by using a voltage divider. In such a case, no high voltage at a high frequency from a ballast is present at any open/closed electrical contacts in the LLT lamp, thus no internal fire possible. The scheme can effectively reduce a risk of electric shock and a fire hazard to users during relamping or maintenance.

In one embodiment, the LLT lamp further comprises at least two magnets and at least two Hall effect sensors configured to form at least two magnetic proximity sensor pairs at the two ends of the LLT lamp and to provide a non-contact actuation of the at least two pairs of electrical contacts. When both two lamp bases of the LLT lamp are in the sockets, there is no exposed at least one conductor that installers can possibly touch, creating an electric shock hazard. In this case, both the at least two pairs of electrical contacts are electrically connected by the non-contact actuation of the at least two magnetic proximity sensor pairs, whereas a low DC voltage is applied to the LED driving circuit to control a substantial electric current to flow into the one or more LED arrays. However, when either one of the two lamp bases of the LLT lamp is not in the respective socket, the electric shock hazard occurs. In this case, the respective one of the at least two magnetic proximity sensor pairs associated with the exposed lamp base is not actuated with respective one of the at least two electrical contacts not electrically connected. Because the at least two electrical contacts are interconnected at a low voltage input of the LED driving circuit, the low DC voltage does not apply to the LED driving circuit, disabling operation of the LED driving circuit. No substantial electric shock current can possibly be leaked out of exposed at least one electrical conductor. In other words, once the at least one electrical conductor is exposed during relamping, the driving circuit will not receive a proper voltage to operate. Thus, an overall through-lamp electric shock current may be limited to a small amount rather than the substantial electric shock current flowing through the LED driving circuit and the one or more LED arrays. A controlling electronic circuit, which only supports an actuation of an electronic switch, indeed, has a much smaller power consumption than the one or more LED arrays do. Experimental results show that such a through-lamp electric shock current not going through the one or more LED arrays can be controlled to an acceptable level according to a safety standard UL 935.

In another embodiment, the LLT lamp may further comprise at least two displacement sensors configured to sense if the two ends of the LLT lamp are between the two sockets in the fixture. When both two lamp bases of the LLT lamp are in the sockets, there is no exposed at least one conductor that installers can possibly touch, creating an electric shock hazard. In this case, both the at least two pairs of electrical contacts are electrically connected by an actuation of displacement sensors, whereas a low DC voltage is applied to the LED driving circuit, controlling electric current to flow into the one or more LED arrays. However, when either one of the two lamp bases of the LLT lamp is not in the respective socket, the electric shock hazard occurs. In this case, the respective one of the at least two displacement sensors associated with the exposed lamp base is not actuated with respective one of the at least two pairs of electrical contacts not electrically connected. Because at least two pairs of electrical contacts are interconnected at a low voltage input of the LED driving circuit, the low DC voltage does not apply to the LED driving circuit, disabling operation of the LED driving circuit. No substantial electric shock current can possibly be leaked out of the exposed at least one electrical conductor. In other words, once the at least one electrical conductor is exposed during relamping, the LED driving circuit will not receive a proper voltage to operate. Thus, an overall through-lamp electric shock current can be limited to a small amount rather than the substantial electric shock current flowing through the LED driving circuit and the one or more LED arrays.

Furthermore, the use of the low DC voltage in controlling electrical contacts to be on or off has one of unique advantages. That is, no matter whether AC sources is AC mains from an electrical grid or power supplies from various ballasts, no significant arc can be observed due to a low DC current associated with the low DC voltage. In other words, an internal arcing and firing will never occur using this approach, thus eliminating any internal fire hazard and enhancing operation reliability.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION OF THE INVENTION

Figure 1:
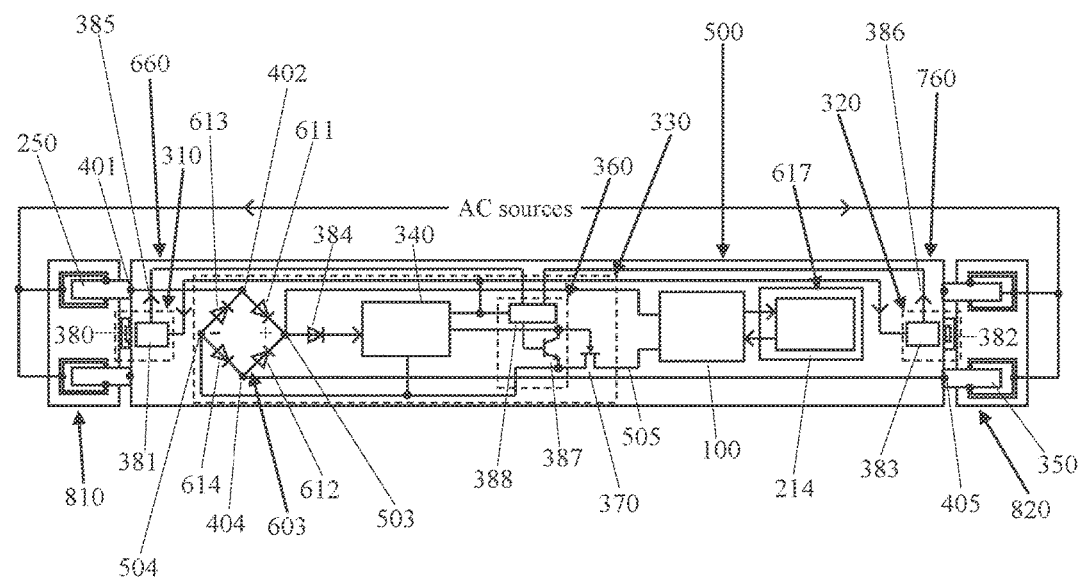
FIG. 1 is an embodiment of an LLT lamp installed in lamp fixture sockets connected with AC sources that include AC mains and ballasts according to the present disclosure.

FIG. 1 is an embodiment of a linear LED tube (LLT) lamp installed in lamp fixture sockets connected with alternate current (AC) sources that include AC mains and ballasts according to the present disclosure. The LLT lamp 500 comprises a housing having two ends; two lamp bases 660 and 760 each having at least one electrical conductor 250 and 350 at each end of the housing; a first magnetic proximity sensor pair 310 close to the lamp base 660; a second magnetic proximity sensor pair 320 close to the lamp base 760; a controller 330; an LED driving circuit 100; and one or more LED arrays 214 disposed on an LED PCB 617 with the one or more LED arrays 214 connected to the LED driving circuit 100. The controller 330 comprises a set of voltage dividers and regulators 340, a switch control unit 360, at least one switch 370, and a full-wave rectifier 603 consisting of diodes 611, 612, 613, and 614 interconnected at ports 402, 404, 503, and 504. The first magnetic proximity sensor pair 310 comprises a magnet 380 and a Hall effect sensor 381. Similarly, the second magnetic proximity sensor pair 320 comprises a magnet 382 and a Hall effect sensor 383. The full-wave rectifier 603 is configured to convert an AC voltage from the AC mains or the ballasts into a direct current (DC) voltage with a voltage of V+ at the port 503 applied to the LED driving circuit 100. The set of voltage dividers and regulators 340 receives the DC voltage from the full-wave rectifier 603 via a diode 384 configured to block an electric current backward flowing to the at least one full-wave rectifier 603 and converts it into a low DC voltage to operate the Hall effect sensors 381 and 383 and the switch control unit 360. When both two lamp bases 660 and 760 are in fixture sockets 810 and 820, there is no exposed at least one conductor 250 or 350 that installers can possibly touch, creating an electric shock hazard. In this case, both the magnets 380 and 382 are respectively in close proximity to the Hall effect sensors 381 and 383, and the magnetic proximity sensor pairs 310 and 320 are actuated to respectively output low-level signals 385 and 386. Such a non-contact actuation of the magnetic proximity sensor pairs 310 and 320 increases operating reliability. The switch control unit 360 comprises a transistor 387 and a logic circuit 388 configured to control the transistor 387, further maneuvering the at least one switch 370 to control a current returned from the LED driving circuit 100. The low-level signals 385 and 386 are inputted to the logic circuit 388 to turn on the at least one switch 370, enabling the current returned from the LED driving circuit 100 back to the port 504, thus completing a power transfer to the one or more LED arrays 214.

When either one of the two lamp bases of the LLT lamp is not in the respective socket, there is a risk of electric shock for installers. In this case, one of the two magnets, say 382, is not in close proximity to the respective Hall effect sensor 383 whereas the other magnet 380 is in close proximity to the other respective Hall effect sensor 381 and ready to operate. However, both Hall effect sensors 381 and 383 need power to operate. At the instant when an installer touches the exposed at least one conductor 350, both Hall effect sensors 381 and 383 are energized, but only the magnetic proximity sensor pair 310 is actuated. That is, only the Hall effect sensors 381 sends a low-level signal to the logic circuit 388, whereas the Hall effect sensor 383 sends a high-level signal to the logic circuit 388 because the magnet 382 is not in close proximity to the Hall effect sensor 383. The logic circuit 388 determines that there is an electric shock risk and controls the transistor 387 to electrically conduct the collector and the emitter of the transistor 387, subsequently turning off the at least one switch 370. No substantial electric current returned from the LED driving circuit 100 and the at least one or more LED arrays 214 can possibly leak out from the port 504, further flowing to the exposed at least one conductor 350. Thus, the LLT lamp does not light up. In other words, once the at least one electrical conductor 250 and 350 is exposed during relamping, the LED driving circuit 100 will not receive power to operate. Thus, an overall through-lamp electric shock current may be limited to a small amount that needs at least to operate the set of voltage dividers and regulators 340, the logic circuit 388, the two Hall effect sensors 381 and 383, the transistor 387, and the at least one switch 370, rather than a substantial electric shock current flowing through the LED driving circuit 100 and the one or more LED arrays 214. Indeed, power consumption of the control electronics, which supports the electric shock detection and actuation of at least one switch 370, is much smaller than that of the LED driving circuit 100 powering one or more LED arrays 214. Experimental results show that the through-lamp electric shock current can be controlled to an acceptable level according to a safety standard UL 935.

In FIG. 1, the full-wave rectifier 603 is always connected to the at least one electrical conductor 250 and the at least one electrical conductor 350 and receives AC power from the AC mains or the ballasts. This is different from prior art, which uses double safety switches to control the at least one electrical conductor 250 and the at least one electrical conductor 350 to make connections to the full-wave rectifier 603. In FIG. 1, the LED driving circuit 100 directly connects to the full-wave rectifier 603, receiving the DC voltage V+ from the port 503. The LED driving circuit 100 may comprise its own full-wave rectifier to energize the one or more LED arrays 214. Only when both the first and the second magnetic proximity sensor pairs are actuated, can the at least one switch 370 controlled by the switch control unit 360 conduct an electric current returned from the LED driving circuit 100 to the full-wave rectifier 603, completing a power transfer. Specifically, when both the at least one electrical conductor 250 and the at least one electrical conductor 350 in each lamp base are inserted into the lamp fixture sockets 810 and 820, the controller 330 receives power from the AC sources and operates to individually actuate the first and the second magnetic proximity sensor pairs 310 and 320. For a positive cycle, the electric current from one port of the AC sources, AC mains or ballasts, can flow from the electrical contact 401 of the at least one electrical conductor 250, the full-wave rectifier 603 through the diode 611 to the port 503 of the LED driving circuit 100, further down into the one or more LED arrays 214, and return to a port 505 of the LED driving circuit 100. Because both the first and the second magnetic proximity sensor pairs 310 and 320 are actuated, the at least one switch 370 is "on". The electric current continues to flow through the port 504, the diode 614 of the full-wave rectifier 603, the electrical contact 405 of the at least one electrical conductor 350 to the other port of the AC sources, completing the positive half cycle power transfer. For a negative half cycle, the electric current from one port of the AC sources can flow from the electrical contact 405 of the at least one electrical conductor 350, the full-wave rectifier 603 through the diode 612 to the port 503 of the LED driving circuit 100, further down into the one or more LED arrays 214, and return to the port 505 of the LED driving circuit 100. The electric current continues to flow through the diode 613 of the full-wave rectifier 603, the electrical contact 401 of the at least one electrical conductor 250 to the other port of the AC sources, completing the negative half cycle power transfer.

When the lamp base 660 is inserted in the lamp socket 810, which connects to one port of the AC sources (say, the left side in FIG. 1), the LLT lamp 500 is energized. If the first and the second magnetic proximity sensor pairs 310 and 320 do not exist to control the electric current return, a substantial through-lamp electric shock current from the LED driving circuit 100 and the one or more LED arrays 214 can always come out through the at least one electrical conductor 350, which may be exposed to a user for an electric shock. The electric shock may be fatal depending on impedance between the user's body and the earth ground. On the other hand, if the first and the second magnetic proximity sensor pairs 310 and 320 exist and send the low-level signals to the controller 330 to control the electric current returned from the LED driving circuit 100, then the through-lamp electric shock current from the LED driving circuit 100 and the one or more LED arrays 214 is zero. However, the through-lamp electric shock current can come out from the controller 330 that needs power to actuate the first and the second magnetic proximity sensor pairs 310 and 320, to determine for the logic circuit 388 if the electric shock hazard occurs, and to control the at least one switch 370. Because such a load is a fraction of one from the one or more LED arrays 214, the through-lamp electric shock current in this case can be controlled to an acceptable level not exceeding a specific value defined in the safety standard UL 935, no fatal electric shock possible. In a normal operation when the at least one electrical conductor 250 and the at least one electrical conductor 350 are connected to the AC mains or the ballast in a double-ended wiring lamp fixture, the LED driving circuit 100 can receive power to drive the one or more LED arrays 214. As can be seen in FIG. 1, two sockets in each of the external fixture lamp sockets 810 and 820 are shunted, meaning that as long as the at least one electrical conductor 250 in the lamp base 660 and the at least one electrical conductor 350 in the lamp base 760 are connected to the AC sources, the LLT lamp using the approach depicted in FIG. 1 can operate with an acceptable through-lamp electric shock current, which is deemed safe for users. In FIG. 1, the LED driving circuit 100 may comprise a second at least one full-wave rectifier configured to receive the DC voltage from the at least one full-wave rectifier 603 and to operate the one or more LED arrays 214. The at least one switch 370 may comprise a metal-oxide-semiconductor field-effect transistor (MOSFET), a transistor, a back-to-back thyristor, a silicon-controlled rectifier (SCR), a relay, or a combination thereof. Also such devices may be connected with some snubber circuits to maintain their functionality under voltage spikes. The low DC voltage used to operate the magnetic proximity sensor pairs 310 and 320 meets voltage requirements of a Class 2 circuit, which is considered safe from a fire initiation viewpoint and provides an acceptable level of protection from electrical shock.

Figure 2:
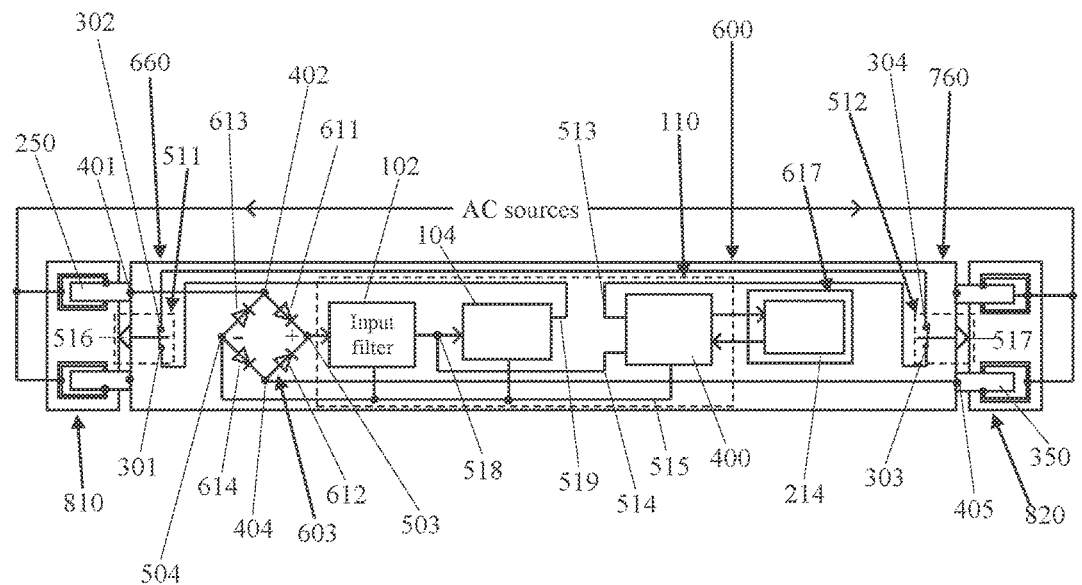
FIG. 2 is another embodiment of an LLT lamp installed in lamp fixture sockets connected with AC sources that include AC mains and ballasts according to the present disclosure.

FIG. 2 is another embodiment of an LLT lamp installed in lamp fixture sockets connected with AC sources that include AC mains and ballasts according to the present disclosure. The LLT lamp 600 comprises a housing having two ends; two lamp bases 660 and 760 each having at least one electrical conductor 250 and 350 at each end of the housing; a first displacement sensor pair 511 close to the lamp base 660 comprising a displacement sensor 516 and a first pair of electrical contacts 301 and 302; a second displacement sensor pair 512 close to the lamp base 760 comprising a displacement sensor 517 and a second pair of electrical contacts 303 and 304; a full-wave rectifier 603 comprising diodes 611, 612, 613, and 614 interconnected at ports 402, 404, 503, and 504; an LED driving circuit 110; and one or more LED arrays 214 disposed on an LED PCB 617 with the one or more LED arrays 214 connected to the LED driving circuit 110. The LED driving circuit 110 comprises an input filter 102 connected to the port 503 of the full-wave rectifier 603, one or more start-up resistors 104 connected to the input filter 102, and a driver 400 connected to the one or more LED arrays 214. The driver 400 comprises a low voltage input 513, a high voltage input 514 connected to a port 518 of the input filter 102, and a common port 515 connected to the port 504 of the full-wave rectifier 603. The high voltage input 514 is configured to connect to a Buck converter (in FIGS. 3 and 4), whereas the low voltage input 513 is originally configured to connect to the one or more start-up resistors 104 and to control the Buck converter to provide a proper current and voltage to drive the one or more LED arrays 214. In FIG. 2, the first and the second pairs of electrical contacts 301, 302, 303, and 304 are interconnected in series and looped between the one or more start-up resistors 104 and the low voltage input 513 of the driver 400. The full-wave rectifier 603 is always connected to the at least one electrical conductor 250 and the at least one electrical conductor 350 and receives AC power from the AC mains or the ballasts. As in FIG. 1, this is different from prior art, which uses double safety switches to make connections between the at least one electrical conductors 250 and 350 and the full-wave rectifier 603. In FIG. 2, the LED driving circuit 110 directly connects to the full-wave rectifier 603, receiving the DC voltage V+ from the port 503. When the first and the second pairs of electrical contacts 301, 302, 303, and 304 are not individually electrically connected, the one or more start-up resistors 104 is not connected to the low voltage input 513 of the driver 400, thus disabling the driver 400 to power one or more LED arrays 214. Without electric current returned from one or more LED arrays 214 to reach an exposed at least one electrical conductor 250 or 350, no electric shock hazard will occur even though the at least one electrical conductor 250 and the at least one electrical conductor 350 are electrically connected with the full-wave rectifier 603, which energizes the LED driving circuit 110.

When both the at least one electrical conductor 250 and the at least one electrical conductor 350 in each lamp base are respectively inserted into the lamp fixture sockets 810 and 820, the one or more start-up resistors 104 provides a low DC voltage to individually actuate the first and the second pairs of electrical contacts 301, 302, 303, and 304 in a way that an electric current can conduct between the first pair of electrical contacts 301 and 302 and between the second pair of electrical contacts 303 and 304. The electric current can flow from an output port 519 of the one or more start-up resistors 104, the first pair of electrical contacts 301 and 302, the second pair of electrical contacts 303 and 304, entering the low voltage input port 513 of the driver 400. For a positive cycle, the electric current from one port of the AC sources can flow from the electrical contact 401 of the at least one electrical conductor 250, the full-wave rectifier 603 through the diode 611 to the port 503 of the LED driving circuit 110, going through the input filter 102. The low DC voltage from the one or more start-up resistors 104 is applied to the first pair of electrical contacts 301 and 302, the second pair of electrical contacts 303 and 304, entering the low voltage input port 513 of the driver 400. Whereas the high voltage input port 514 of the driver 400 is already energized, the low DC voltage from the one or more start-up resistors 104 starts to operate the driver 400, powering the one or more LED arrays 214. The current returns to the common port 515 of the driver 400, continuing to flow through the diode 614 of the full-wave rectifier 603, the electrical contact 405 of the at least one electrical conductor 350 to the other port of the AC sources, completing the positive half cycle power transfer. For a negative half cycle, the electric current from one port of the AC sources can flow from the electrical contact 405 of the at least one electrical conductor 350, the full-wave rectifier 603 through the diode 612 to the port 503 of the LED driving circuit 110. Similar to the current flow in the LED driving circuit 110 for positive cycle, the electric current continues to flow through the diode 613 of the full-wave rectifier 603, the electrical contact 401 of the at least one electrical conductor 250 to the other port of the AC sources, completing the negative half cycle power transfer.

When the lamp base 660 is inserted in the lamp socket 810, which connects to one port of the AC sources (say, the left side in FIG. 1), the LLT lamp 600 is energized. If the first and the second pairs of electrical contacts 301, 302, 303, and 304 do not exist to control the electric current conduction, a substantial through-lamp electric shock current from the LED driving circuit 110 and the one or more LED arrays 214 can always come out through the at least one electrical conductor 350, which may be exposed to a user for an electric shock. The electric shock may be fatal depending on impedance between the user's body and the earth ground. On the other hand, if the first and the second pairs of electrical contacts 301, 302, 303, and 304 exist and are connected in series and looped between the one or more start-up resistors 104 and the driver 400, then the through-lamp electric shock current from the LED driving circuit 100 and the one or more LED arrays 214 can be set to zero. However, a small amount of the through-lamp electric shock current will come out from the input filter 102 and some safety varistors and capacitors (not shown in FIG. 2) in front of the full-wave rectifier 603, which need power to operate. Because such a load is a fraction of the load from the one or more LED arrays 214, its through-lamp electric shock current can be controlled to an acceptable level not exceeding a specific value defined in the safety standard UL 935, no fatal electric shock possible. In a normal operation when the at least one electrical conductor 250 and the at least one electrical conductor 350 are connected to the AC mains or the ballasts in a double-ended wiring lamp fixture, the LED driving circuit 110 can receive power to drive the one or more LED arrays 214. As can be seen in FIG. 2, two sockets in each of the external fixture lamp sockets 810 and 820 are shunted, meaning that as long as the at least one electrical conductor 250 in the lamp base 660 and the at least one electrical conductor 350 in the lamp base 760 are connected to the AC sources, the LLT lamp adopting the approach depicted in FIG. 2 can operate with an acceptable through-lamp electric shock current, which is deemed safe for users.

Figure 3:
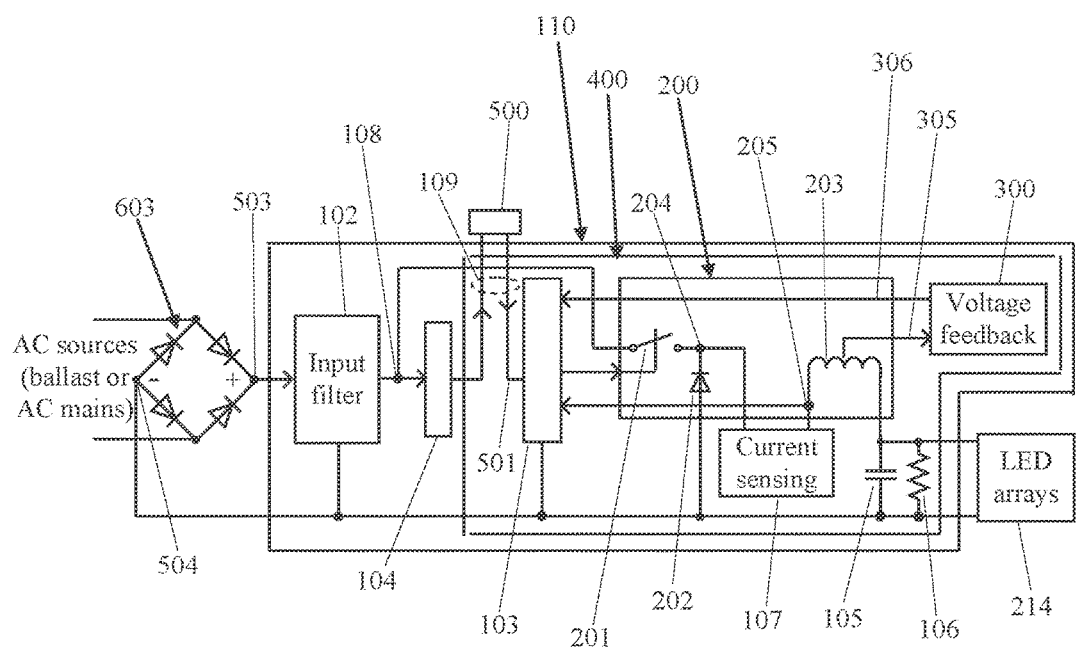
FIG. 3 is a block diagram of an LED driving circuit used in an LLT lamp depicted in FIG. 2 operable with either the AC mains or ballasts according to the present disclosure.

FIG. 3 is a block diagram of an LED driving circuit used in an LLT lamp depicted in FIG. 2 operable with either the AC mains or the ballasts according to the present disclosure. A full-wave rectifier 603 connecting to an AC source, either the AC mains or the ballast, converts an AC voltage into a DC voltage. An LED driving circuit 110, connecting to the full-wave rectifier 603, comprises an input filter 102 used to filter the input voltage and to suppress EMI noise created in the LED driving circuit 110, one or more start-up resistors 104, a driver 400, an electrical jumper pair 109 connecting between the one or more start-up resistors 104 and the driver 400 with a terminal module 500 outside the LED driving circuit 110, The driver 400 comprises a power factor correction (PFC) and control device 103, a Buck converter 200 in communicating with the PFC and control device 103, an output capacitor 105 in parallel with a resistor 106 connected to the Buck converter 200 to build up an output voltage and to power the one or more LED arrays 214, a current sensing resistor 107, and a voltage feedback module 300 extracting partial energy from the output voltage to sustain the PFC and control device 103. The driver 400 has a high voltage input port 108 and a low voltage input port 501. The terminal module 500 comprises the first pair of electrical contacts 301 and 302 and the second pair of electrical contacts 303 and 304 interconnected in series, as depicted in FIG. 2. Either one of the two pairs of electrical contacts not electrically connected results in a lost connection at the low voltage input port 501 and renders an electrical disconnection between the one or more start-up resistors 104 and the driver 400. The full-wave rectifier 603 has four input/output ports, among which a high electric potential appears at the input/output port 503 as V+, and a low electric potential appears at the input/output port 504 as V−, respectively connecting to the high side and the low side of the input filter 102 with the low electric potential port 504 as a common ground. The Buck converter 200 comprises a switch 201 controlled by the PFC and control device 103, a diode 202, and an inductor 203 with its current charging and discharging controlled by the switch 201. When both two pairs of electrical contacts are individually connected, the electrical jumper pair 109 connecting to the terminal module 500 conducts so that a low DC voltage from the one or more start-up resistors 104 applies to the PFC and control device 103 to sustain its operation. Then the driver 400 can detect zero current in the inductor 203 within an AC cycle of an input voltage generating a zero current detection signal and controls the switch 201 on and off with a constant on-time and a varied off-time controlled by the zero current detection signal. By adapting switching frequencies for a high frequency associated with a ballast and a low frequency associated with the AC mains, the PFC and control device 103 controls the switch 201 on and off in a way that the inductor 203 is charged during on-time and discharged during off-time, and that a desired output voltage $V_o$ across the one or more LED arrays 214 is reached to light up the one or more LED arrays 214. The average inductor current is thus equal to the output current that flows into the LED array 214. When the switch 201 is on, the diode 202 is reverse-biased, and an input current flows from an output port 108 in the input filter 102, the switch 201, the first port 204 of the current sensing resistor 107, the current sensing resistor 107 itself, and the second port 205 of the current sensing resistor 107, into the inductor 203. When the current flowing into the inductor 203 increases, the voltage across the current sensing resistor 107 increases. The second port 205 of the current sensing resistor 107 connects with the PFC and control device 103, which continuously receives signals and adjusts the off-time such that the output voltage and current to the one or more LED arrays 214 are regulated to meet the output requirements. The output capacitor 105 in parallel with the resistor 106 connects to the inductor 203, receiving energy to build up an output voltage and to power the one or more LED arrays 214.

The inductor 203 configured as an autotransformer has a center-tapped port connecting to the first port 301 of the voltage feedback module 300 comprising a diode. The voltage feedback module 300 has two connection ports 305 and 306, with the first connection port 305 connecting to the center-tapped port of center-tapped inductor 203 and with the second connection port 306 connecting to the PFC and control device 103. The PFC and control device 103 has an input capacitor (not shown) with a voltage built up to supply an internal logic control circuit (not shown) in the PFC and control device 103 When the voltage decreases due to its increased internal operations and controls, and when the voltage at the center-tapped port of the inductor 203 is higher than the supplying voltage, the diode in the voltage feedback module 300 conducts to supply a current to the PFC and control device 103 and sustain its operations. The function of the voltage feedback module 300 is essential because the LED driving circuit 110 has a wide range of operating voltages not only 110 and 277 VAC for AC mains but also 375~400 VAC for a ballast. The one or more start-up resistor 104 is so designed to operate a LLT lamp at the lowest input voltage 110 VAC. When the highest voltage 400 VAC from the ballast comes in, a higher proportional voltage appears at an input of the internal logic control circuit. Therefore an operating voltage for the internal logic control circuit must be in a wide range such as 11~35 VDC rather than 5~15 VDC as in a conventional logic control device. To meet requirements of start-up time and current without turn-on failure or flickering occurred at the lamp start-up, the input capacitor in the PFC and control device 103 with a minimum capacitance is designed and used at the input of the internal logic control circuit. The voltage feedback module 300 is thus needed to pump in energy in time and to sustain the operating voltage and ensure no flickering occurred when operating the LLT lamp.

When the switch 201 is off, the diode 202 is forward-biased, and the inductor 203 discharges with a loop current flowing from the one or more LED arrays 214, the diode 202, the current sensing resistor 107, back to the inductor 203. The current sensing resistor 107 keeps track of the output current and feedbacks to the PFC and control device 103 to further control the switch 201 on and off. The closed loop operation in both on-time and off-time of the switch 201 ensures the output current to be accurately controlled within 4%.

Figure 4:
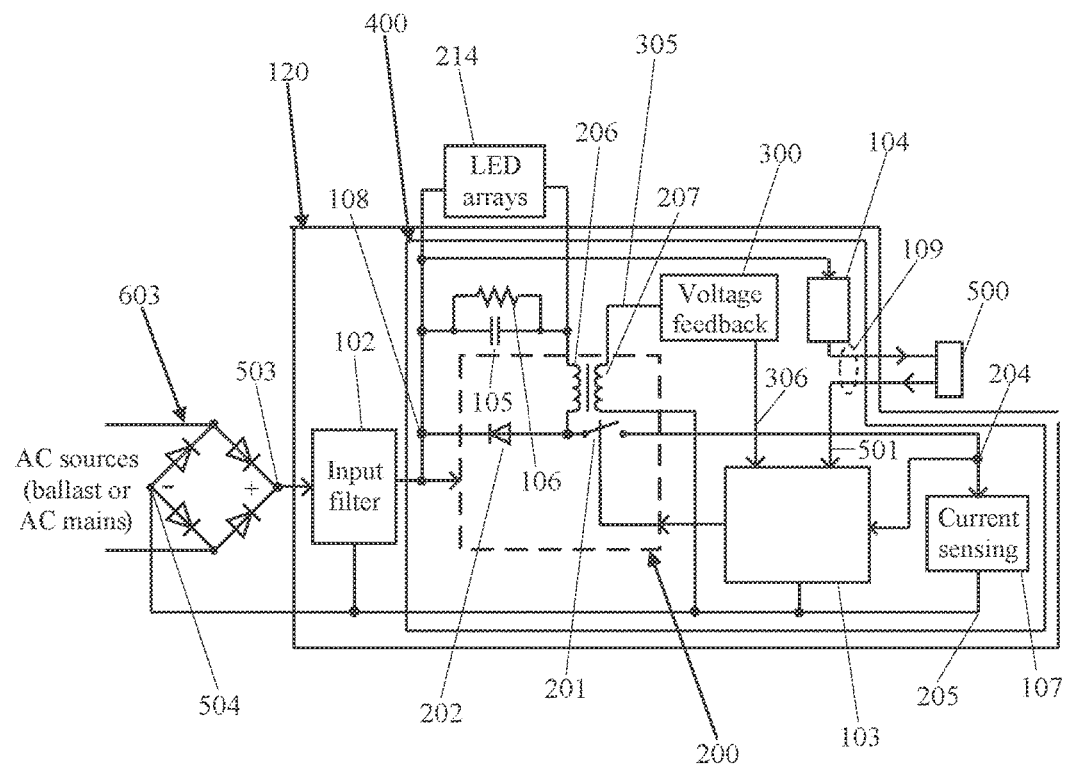
FIG. 4 is a block diagram of another embodiment of an LED driving circuit used in an LLT lamp depicted in FIG. 2 operable with either the AC mains or ballasts according to the present disclosure.

FIG. 4 is a block diagram of another embodiment of an LED driving circuit used in an LLT lamp depicted in FIG. 2 operable with either the AC mains or the ballasts according to the present disclosure. The LED driving circuit 120 in FIG. 4 has all the components as the LED driving circuit 110 in FIG. 3, except that interconnections are different, and a transformer 206 in FIG. 4 replaces the center-tapped inductor 203 in FIG. 3. In FIG. 4, the same numerals are used for the same components as in FIG. 3. As in FIG. 3, the LED driving circuit 120, connecting to the full-wave rectifier 603, comprises an input filter 102, one or more start-up resistors 104, a driver 400, an electrical jumper pair 109 connecting between the one or more start-up resistors 104 and the driver 400 with a terminal module 500 outside the LED driving circuit 120, The driver 400 comprises a PFC and control device 103, a Buck converter 200 in communicating with the PFC and control device 103, an output capacitor 105 in parallel with a resistor 106 connected to the Buck converter 200 to build up an output voltage and to power the one or more LED arrays 214, a current sensing resistor 107, and a voltage feedback module 300 extracting partial energy from the output voltage to sustain the PFC and control device 103. The terminal module 500 comprises the first pair of electrical contacts 301 and 302 and the second pairs of electrical contacts 303 and 304 interconnected in series, as depicted in FIG. 2. Either one of the two pairs of electrical contacts not electrically connected renders an electrical disconnection between the one or more start-up resistors 104 and the driver 400. In FIG. 4, the driver 400 has a high voltage input port 108 and a low voltage input port 501. When the power is on, the high voltage input port 108 of the driver 400 receives an input current via the input filter 102, and the switch 201 controlled by the PFC and control device 103 is ready to be turned on to control the Buck converter 200. However, when the terminal module 500 is off, the low voltage input port 501 loses a connection, meaning that the driver 103 is not yet operable. Only when the first pair of electrical contacts 301 and 302 and the second pairs of electrical contacts 303 and 304 in the terminal module 500 are individually connected, can the switch 201 be controlled to turn on or off. When the switch 201 is on, the diode 202 is reverse-biased, and the input current goes from the resistor 106, a primary side of the transformer 206, the switch 201, and the current sensing resistor 107 to the common ground 504, completing an AC cycle. When the input current goes into the primary side of the transformer 206, energy is stored in it. The PFC and control device 103 detects the input voltage level and control the switch 201 on and off in a way that a desired output voltage $V_o$ across the one or more LED arrays 214 is reached to light up the one or more LED arrays 214. When the switch 201 is off, the diode 202 is forward-biased, and the primary side of the transformer 206 releases the energy stored, resulting in a loop current flowing from the diode 202 and the one or more LED arrays 214, back to the primary side of the transformer 206, completing the energy transfer to the one or more LED arrays 214. When the switch 201 is on, the input current flows into the one or more LED arrays 214, the primary side of the transformer 206, the switch 201, and the current sensing resistor 107, creating a voltage drop across the current sensing resistor 107. The voltage appearing at the port 204 of the current sensing resistor 107 inputs to the PFC and control device 103 to control the off-time of the switch 201. The voltage feedback module 300 has two connection ports 305 and 306, with the first connection port 305 connecting to a high side of a secondary winding 207 in the transformer 206 and with the second connection port 306 connecting to the PFC and control device 103, as in FIG. 3. The voltage feedback module 300 continuously monitors the output voltage by using the secondary winding 207 in the transformer 206. When the voltage at the high side of the secondary winding 207 is higher than a becoming lower operating voltage in the PFC and control device 103 due to increased internal operations, the diode (not shown) in the voltage feedback module 300 conducts to supply energy in time through the second connection port 306 to sustain the operating voltage in the PFC and control device 103.

In FIGS. 1-4, the low DC voltage are used to control the through-lamp electric shock current flowing out from the LED driving circuit and the one or more LED arrays to reduce a risk of electric shock. The use of such a low DC voltage in controlling electrical contacts to be on or off has one of unique advantages. That is, no matter whether AC sources is AC mains from an electrical grid or power supplies from various ballasts, no significant arc can be observed due to a low current associated with the low voltage. In other words, an internal arcing and firing will never occur using this approach, thus eliminating any internal fire hazard and enhancing operation reliability.

Whereas preferred embodiments of the present disclosure have been shown and described, it will be realized that alterations, modifications, and improvements may be made thereto without departing from the scope of the following claims. Another kind of the electric shock and internal fire prevention schemes in an LED-based lamp using various kinds of combinations to accomplish the same or different objectives could be easily adapted for use from the present disclosure. Accordingly, the foregoing descriptions and attached drawings are by way of example only, and are not intended to be limiting.

What is claimed is:

1. A linear light-emitting diode (LED) tube lamp, comprising:
   a housing having two ends;
   at least one LED printed circuit board (LED PCB) disposed between the two ends of the housing, the at least one LED PCB comprising one or more LED arrays disposed thereon;
   two lamp bases respectively connected to the two ends of the housing, each lamp base comprising a magnetic proximity sensor pair and at least one electrical conductor configured to connect to a lamp fixture socket that is wired to connect to either alternate current (AC) mains or ballasts;
   a controller comprising a first full-wave rectifier configured to convert an input AC voltage into a direct current (DC) voltage, a set of voltage dividers and regulators configured to convert the DC voltage into a low DC voltage, a switch control unit coupled to receive signals from the magnetic proximity sensor pair in each lamp base, and at least one switch controlled by the switch control unit; and an LED driving circuit configured to receive the DC voltage and to return an electric current via the at least one switch enabled by the controller so as to drive and to light up the one or more LED arrays;

wherein:

the low DC voltage is configured to operate the magnetic proximity sensor pair in each lamp base;

when either one of the two lamp bases is out of the lamp fixture socket, the at least one switch disables an electric current flow from the LED driving circuit, thereby disconnecting an electric shock current returned from the one or more LED arrays to reach the at least one full-wave rectifier; and when the at least one electrical conductor in each lamp base is inserted into the respective lamp fixture socket, the controller enables the LED driving circuit to deliver electrical power to the one or more LED arrays.

2. The linear LED tube lamp of claim 1, wherein the LED driving circuit comprises a second full-wave rectifier configured to receive the DC voltage from the first full-wave rectifier and to operate the one or more LED arrays.

3. The linear LED tube lamp of claim 1, wherein the controller further comprises a diode configured to block an electric current backward flowing to the first full-wave rectifier.

4. The linear LED tube lamp of claim 1, wherein the at least one switch comprises a metal-oxide-semiconductor field-effect transistor (MOSFET), a transistor, a back-to-back thyristor, a silicon-controlled rectifier (SCR), a relay, or a combination thereof.

5. The linear LED tube lamp of claim 1, wherein the low DC voltage meets voltage requirements of a Class 2 circuit.

6. The linear LED tube lamp of claim 1, wherein the switch control unit comprises a transistor configured to control the at least one switch turning on and off.

7. The linear LED tube lamp of claim 1, wherein the switch control unit comprises a logic circuit configured to receive signals from the magnetic proximity sensor pair in each lamp base and to control the at least one switch turning on and off.

8. The linear LED tube lamp of claim 7, wherein the logic circuit comprises one or more logic gates.

9. The linear LED tube lamp of claim 8, wherein the one or more logic gates are implemented by one or more transistors.

10. The linear LED tube lamp of claim 1, wherein the magnetic proximity sensor pair in each lamp base comprises a magnet and a Hall effect sensor.

11. The linear LED tube lamp of claim 10, wherein the magnetic proximity sensor pair in each lamp base operates when the respective magnet is in close proximity to the respective Hall effect sensor.

12. A linear light-emitting diode (LED) tube lamp, comprising:

a housing having two ends;

two lamp bases respectively connected to the two ends of the housing, each lamp base comprising a displacement sensor, at least one pair of electrical contacts controlled by the displacement sensor, and at least one electrical conductor configured to connect to a lamp fixture socket that is wired to connect to either alternate current (AC) mains or ballasts;

a full-wave rectifier connected to the at least one electrical conductor in each lamp base and configured to convert an input AC voltage into a direct current (DC) voltage;

at least one LED printed circuit board (LED PCB) disposed between the two ends of the housing, the at least one LED PCB comprising one or more LED arrays disposed thereon; and an LED driving circuit comprising an input filter, one or more start-up resistors, a driver comprising a low voltage input, and an electrical jumper pair, the one or more start-up resistors configured to provide a low DC voltage to couple to the low voltage input of the driver via the electrical jumper pair, wherein:

the at least one pair of electrical contacts in each of the two lamp bases are connected in series and connected to the electrical jumper pair so as to loop between the one or more start-up resistors and the low voltage input of the driver;

when either one of the at least one pair of electrical contacts are not electrically connected, a through-lamp electric shock current does not flow into the driver; and when the at least one electrical conductor in each of the two lamp bases is inserted into the lamp fixture socket, the at least one pair of electrical contacts are actuated by the displacement sensor in each lamp base to deliver the low DC voltage to the driver, thereby operating the driver and powering the one or more LED arrays.

13. The linear LED tube lamp of claim 12, wherein the driver further comprises a high voltage input configured to receive a filtered DC voltage from the input filter, a power factor correction (PFC) and control device, a switch controlled by the PFC and control device, a current sensing resistor, a diode, an inductor with current charging and discharging thereof controlled by the switch, a resistor, an output capacitor in parallel with the resistor and connected to the inductor to build up an output voltage and to power the one or more LED arrays, and a voltage feedback module coupled to draw partial power from the output voltage to sustain an operation of the PFC and control devices, and wherein, responsive to detecting zero current in the inductor within an AC cycle of the input voltage, the PFC and control device generates a zero current detection signal to control the switch turning on and off.

14. The linear LED tube lamp of claim 13, wherein the voltage feedback module comprises a diode.

15. The linear LED tube lamp of claim 13, wherein the switch in the driver operates at a switching frequency greater than or equal to 45 KHz.

16. The linear LED tube lamp of claim 13, wherein the inductor in the driver is of an autotransformer type.

17. The linear LED tube lamp of claim 13, wherein the inductor in the driver is part of a transformer.

18. The linear LED tube lamp of claim 13, wherein the PFC and control device operates in a range approximately between 11 V and 35 VDC.

* * * * *